United States Patent
Ehmke et al.

(10) Patent No.: US 6,856,014 B1
(45) Date of Patent: Feb. 15, 2005

(54) METHOD FOR FABRICATING A LID FOR A WAFER LEVEL PACKAGED OPTICAL MEMS DEVICE

(75) Inventors: John C. Ehmke, Garland, TX (US); Vincent C. Lopes, Lucas, TX (US); John Paul Harris, Whitewright, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/747,862

(22) Filed: Dec. 29, 2003

(51) Int. Cl.[7] .................. H01L 23/48; H01L 23/52; H01L 29/40
(52) U.S. Cl. .................. 257/704; 257/777; 438/107
(58) Field of Search .................. 438/107, 110, 438/113; 257/704, 787, 777, 686, 680; 414/940, 941, 938

(56) References Cited

U.S. PATENT DOCUMENTS

| | | | |
|---|---|---|---|
| 5,798,557 A | | 8/1998 | Salatino et al. |
| 5,915,168 A | | 6/1999 | Salatino et al. |
| 6,586,831 B2 | * | 7/2003 | Gooch et al. ............... 257/704 |
| 6,639,313 B1 | * | 10/2003 | Martin et al. ............... 257/704 |
| 6,686,657 B1 | * | 2/2004 | Kline ......................... 257/727 |
| 6,762,868 B2 | * | 7/2004 | Liu et al. .................... 359/237 |
| 2003/0128044 A1 | * | 7/2003 | Pierce ........................ 324/755 |

* cited by examiner

Primary Examiner—S. V. Clark
(74) Attorney, Agent, or Firm—Charles A. Brill; Wade James Brady, III; Frederick J. Telecky, Jr.

(57) ABSTRACT

A method of individually packaging a multiplicity of devices, such as a spatial light modulator, before the multiplicity of devices formed on a substrate wafer are separated. The method and structure comprises individually sealing each device while the device is still part of sealed by the combination interposer wafer and a cover or window wafer. After each device is sealed by the combination interposer wafer and cover wafer, the combination cover wafer is sawed through down to the substrate wafer. The sealed devices may then be fully separated by scoring and breaking the substrate wafer.

25 Claims, 5 Drawing Sheets

US 6,856,014 B1

METHOD FOR FABRICATING A LID FOR A WAFER LEVEL PACKAGED OPTICAL MEMS DEVICE

TECHNICAL FIELD

The present invention relates to individual packaging of a multiplicity of devices before the devices are separation from the wafer substrate. More particularly, the invention relates to packaging MEMS devices such as spatial light modulators requiring the transmission of light through a transparent protective and sealed cover or lid.

BACKGROUND

Most semiconductor devices, such as integrated circuits, are packaged at the individual die level. However, various types of MEMS devices include moving parts or other attributes that are fragile and can be damaged and/or contaminated by handling or further processing including passivation or dicing. Consequently, it would be advantageous if the individual packaging and sealing of a device could be accomplished on the substrate wafer before dicing or separation. Such wafer packaging is especially suitable for DMD devices to help protect the million plus individual mirrors to avoid handling of the device before the packaging is complete.

SUMMARY OF THE INVENTION

These and other problems are generally solved or circumvented, and technical advantages are generally achieved, by preferred embodiments of the present invention in which a method of individually packing and sealing devices formed on a substrate wafer with a cover wafer is disclosed. The apparatus and steps of manufacturing the device comprise providing a plurality of devices formed on a substrate wafer wherein the substrate wafer has a selected size. An interposer wafer having substantially the same selected size and which defines a plurality of open areas separated by a first plurality of parallel and spaced apart grid members which intersect a second plurality of parallel and spaced apart grid members is bonded to the top or cover wafer. The grid members of the interposer wafer have a selected thickness, which determines the space or air gap between the substrate wafer and the top or cover wafer. The combination of the bonded top or cover wafer and the interposer wafer is then bonded to the substrate wafer to provide and seal the perimeter of each one of the plurality of devices on the substrate wafer between parallel pairs of intersecting grid members and under the top wafer. The individual devices on the substrate wafer are then partially separated by cutting through the top wafer and the grid members down to the substrate wafer. The partially divided devices may then be separated from each other on the substrate wafer by sawing or cleaning the substrate wafer and breaking the devices apart.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
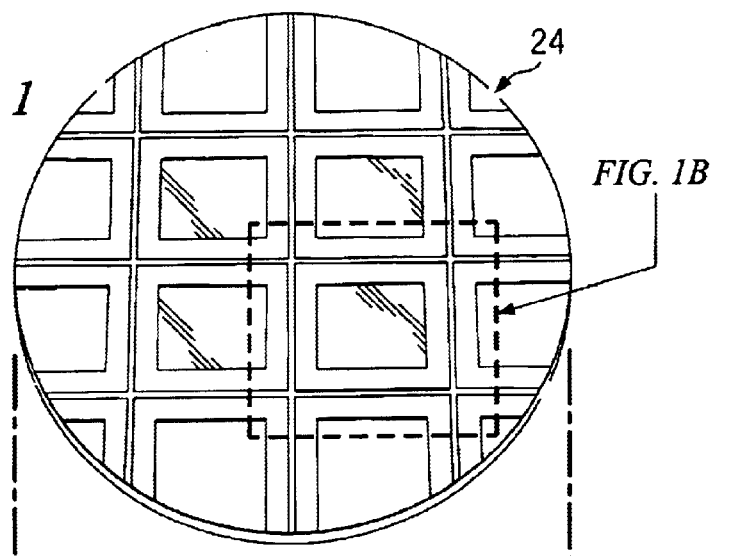
FIG. 1 is a simplified exploded illustration of a combination substrate wafer, interposer wafer and cover or window wafer combined to provide and seal individual devices according to the teachings of the present invention.
Figure 1:
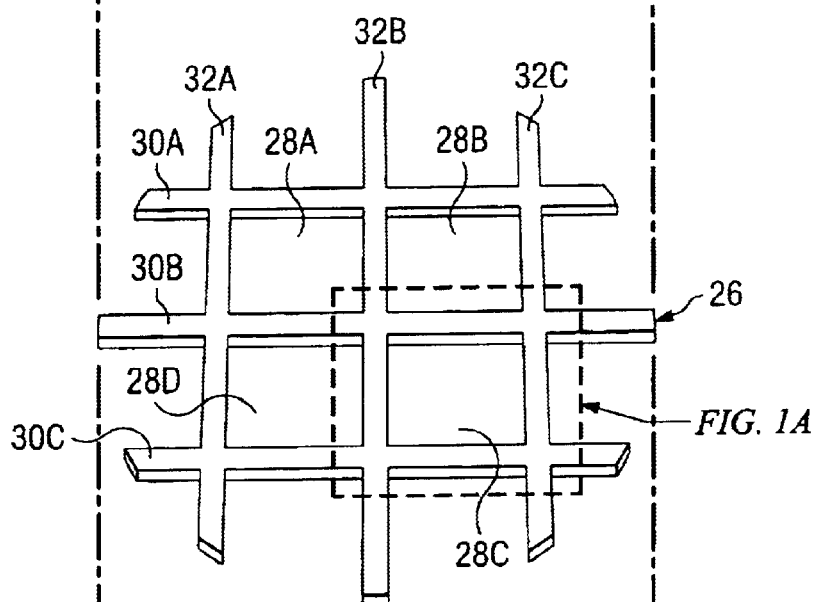
Figure 1:
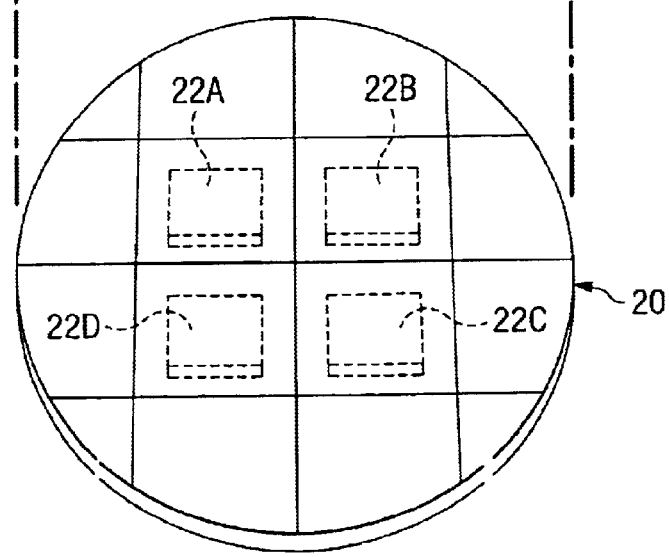
Figure 1A:
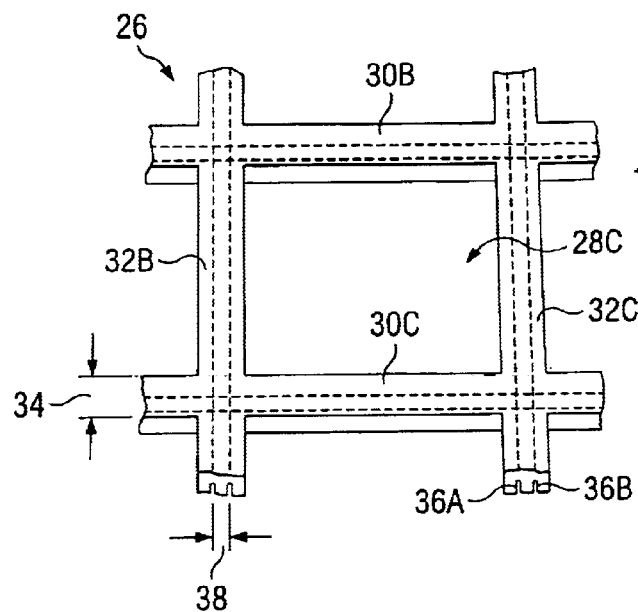
FIGS. 1A, 1B and 1C are enlarged illustrations of portions of FIG. 1.
Figure 1B:
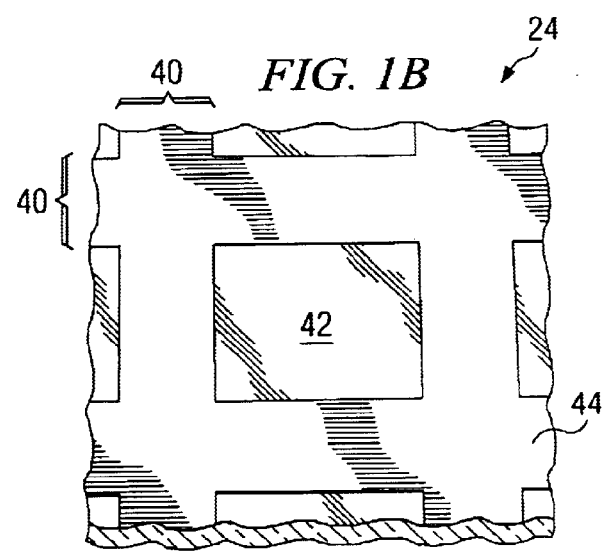
Figure 1C:
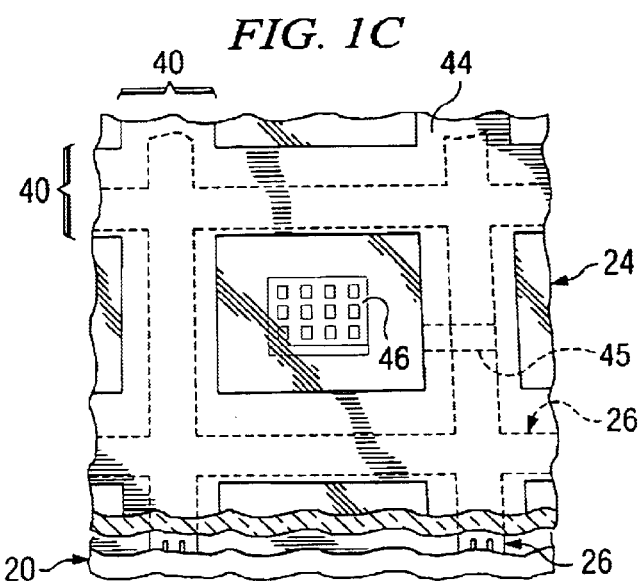

Referring now to FIGS. 1 through 1C, there are shown diagrammatic views illustrating the teachings of the present invention. FIG. 1 is an exploded view of various wafer types used to individually package and seal various types of devices according to the teachings of the present invention. Substrate wafer 20 illustrates a typical wafer such as a silicon wafer having a multiplicity of devices 22a, 22b, 22c and 22d formed thereon. Devices 22a through 22d may be a semiconductor device or other types of devices such as a MEMS device that includes an air space between the device and the cover or lid, which seals the device from the outside environment.

The teachings of this invention are particularly suitable for use with MEMS (mechanical electro mechanical) devices, which requires that light be transmitted from outside the device through the cover or lid sealing the device and onto the interior or active area of the device. One such MEMS device is the DMD™ (digital mircomirror device)

manufactured by Texas Instruments Incorporated of Dallas, Tex. The DMD™ is a spatial light modulator comprised of an array of tiny individually controlled mirrors (for example one million mirrors or more) that may be individually pivoted around a pair of torsional hinges. Light focused on the array of mirrors is modulated as selected ones of the array of mirrors are pivoted so as to reflect light out of the device to a display surface to as to form an image.

Although the substrate wafer 20 of FIG. 1 is illustrated with only four (22a through 22d) devices for convenience, it will be more clearly illustrated hereinafter that each wafer will typically comprise on the order of at least 35 or more devices. Each of the devices is individually sealed to protect the device from the outside environment. However, as mentioned above, the device operates by receiving light and then reflecting the light from selected mirrors. Therefore, the individual mirrors inside the sealed device must receive the light through the cover and also reflect light out of the device through the cover. Therefore, although the apparatus and methods of this invention are applicable to various types of different devices that receive outside light and/or require an air space, the inventive concept is particularly advantageous for use with DMD™ type devices and the following discussions, although applicable to other types of devices, are with respect to a DMD™ device.

Referring again to FIG. 1, there is also included a cover wafer 24 and an interposer wafer 26. Although, as was mentioned above, the present invention is also applicable to devices that do not receive and/or transmit outside light, cover wafer 24 is preferably a transparent wafer having a size or diameter substantially the same as substrate wafer 20. Cover wafer 24 may typically have a thickness of between about 0.7 mm and about 3 mm. According to one embodiment, a thickness of about 1.75 mm has been found to be particularly suitable. Therefore, according to the invention, the cover or window wafer 24 is bonded to the top side of interposer wafer 26 to form a combination cover. Interposer wafer 26 has a selected thickness that determines the air space between the top surface of substrate wafer 20 and the bottom surface of cover or window wafer 24. According to one embodiment of the present invention, wafer 26 has a thickness of between about 0.5 and 1.1 mm.

Interposer wafer 26 is also substantially the same size or diameter as substrate wafer 20 and cover wafer 24, and includes a multiplicity of open areas such as open areas 28a, 28b, 28c and 28d. These open areas are defined by a first plurality of parallel and spaced apart grid members 30a, 30b and 30c in a first direction and a second plurality of parallel and spaced apart grid members such as grid members 32a, 32b and 32c in a second direction that intersect the first plurality of grid members. Again, although only the four open areas are illustrated as being separated by these grid members in the first and second directions, interposer wafer 26 will typically include a much larger number of such grid members in the first and second directions so as to define the same number of open areas as the number of devices on substrate wafer 20. Interposer wafer 26 has a top side and a bottom side, and as mentioned above, the top side is bonded to cover or window wafer 24 by any suitable method, such as for example an adhesive identified as EN239-2 manufactured by the Resin Technology Group Inc. of South Easton, Mass.

Referring now to FIG. 1A, there is shown an enlarged view of open area 28c of FIG. 1 enclosed by a first or horizontal pair of parallel grid members 30b and 30c and a second or vertical pair of the parallel grid members 32b and 32c. As can be seen, the first and second plurality of grid members have a width as indicated by double-headed arrow 34 and according to one embodiment of the invention, each of the first and second plurality of grid members that enclose one of the devices on substrate wafer 20 includes a pair of saw kerfs 36a and 36b spaced apart as indicated by double-headed arrow 38. The saw kerfs extend from the bottom side of the interposer wafer 26 partially through and toward the top surface of the grid members making up the interposer wafer 26 and will be discussed in greater detail hereinafter.

FIG. 1B illustrates an enlarged portion of cover or window wafer 24. Although cover wafer 24 could be completely opaque or completely transparent for some applications, if the wafer is to be used to seal a DMD™ device, it has been found to be preferable to provide a window aperture of a specific size. The use of a window aperture assures that light focused on the device from an outside source is limited to a more specific or precise area on the substrate wafer 20 by an aperture mask as indicated in FIG. 1B. Aperture mask 40 includes a border to define a transparent area 42 of a specific size. It will also be appreciated that the area 44 between adjacent aperture masks are substantially in register with the grid members of interposer wafer 26 when the two wafers 24 and 20 are bonded together.

The bottom side of the first and second pluralities of grid members making up interposer wafer 26 of the combined interposer wafer and cover wafer is then bonded to the substrate wafer 20 such that each of the active devices formed on the substrate wafer 20 are sealed and enclosed by intersecting parallel pairs of the first and second grid members. This is illustrated in FIG. 1C which is a top view of a single device comprising the combination of the substrate wafer 20, cover or window wafer 24, and interposer wafer 26. The sealed device 46 is visible through the transparent portion of the window or cover wafer 26. Each of the sealed devices comprising the completed wafer structure are then partially separated by sawing through the window or cover wafer 24 in the areas 44 between a pair of adjacent aperture masks, and through a selected depth into the first and second multiplicity of grid members. The device can then be completely separated by any suitable method as well known by those skilled in the art such as by sawing completely through the substrate wafer portion 20 or by scribing and breaking the substrate wafer portion 20. It may also be desirable to have a vent or opening, such as shown at 45 in FIG. 1C, in one of the grid members surrounding the device so that the package may be passivated by the introduction of a passivation vapor through the vent. This approach to passivation avoids adhesion problems often caused by passivation methods that occur before the cover bonding. After the passivation, the vent or opening 45 may be plugged with a plug or epoxy.

Referring now to FIGS. 2–7, there are illustrated more detailed top and edge views of a substrate wafer, an interposer wafer and a cover or window wafer and the combination wafer structures during various manufacturing steps.

Figure 2:
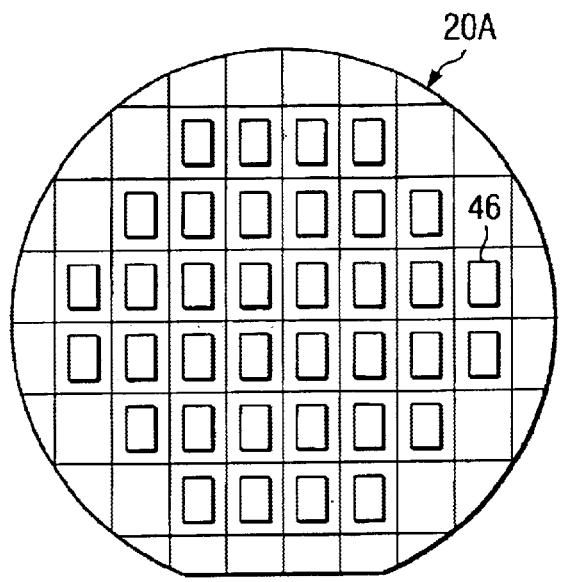
FIGS. 2 and 2A are a top view and edge view of a substrate wafer having a number of MEMS devices formed thereon.
Figure 2A:
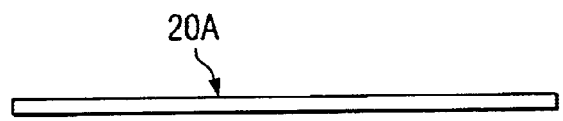
Figure 3:
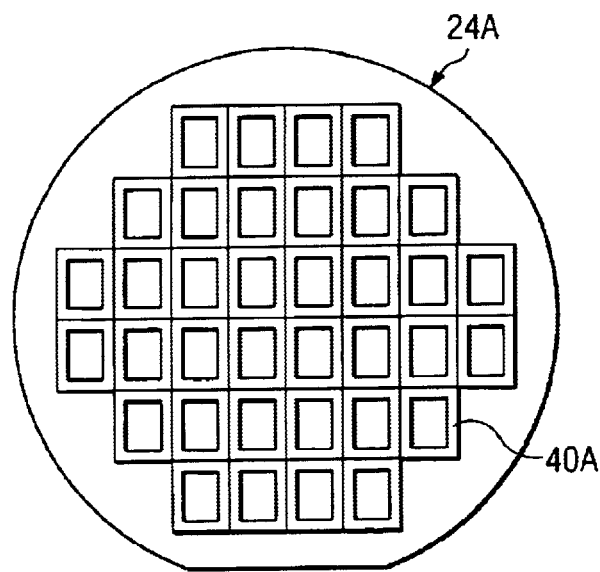
FIGS. 3 and 3A illustrate a top view and edge view of a top or window wafer and an interposer wafer bonded together.
Figure 3A:
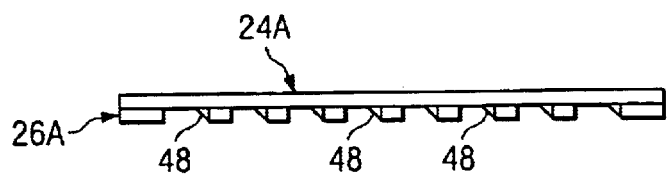
Figure 4:
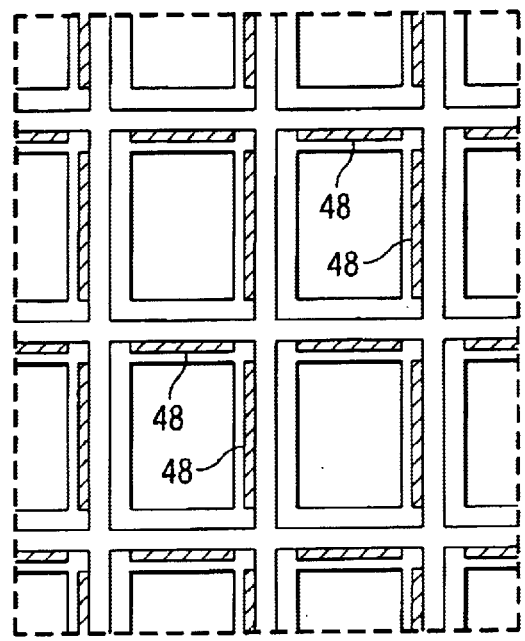
FIG. 4 is an enlarged detail view of FIG. 3 showing the addition of getter material to the combination structure.

For example, referring now to FIGS. 2 and 2A, there is illustrated a substrate wafer 20a having 36 devices, such as for example, DMD™ light modulators 46. FIGS. 3 and 3A illustrate a combination cover or window wafer 24a with aperture mask 40a bonded to an interposer wafer 26a. Also shown in FIG. 3A and in more detail in FIG. 4 are strips of one type, of getter material 48 applied to at least one of the sidewalls of the first and second plurality of grid members of interposer wafer 26a for each of the defined open areas such that at least one strip of getter material is enclosed with the device sealed by the enclosing grid members.

Figure 5:
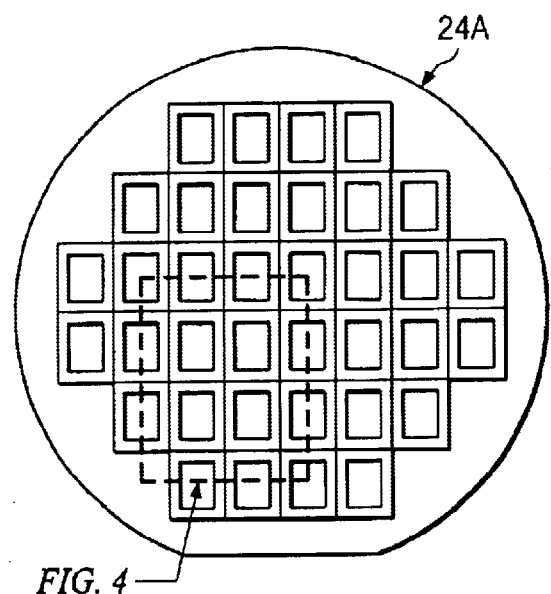
FIGS. 5 and 5A illustrate a top and edge view of the substrate wafer, interposer wafer with getter materials and top wafer all bonded together.
Figure 5A:
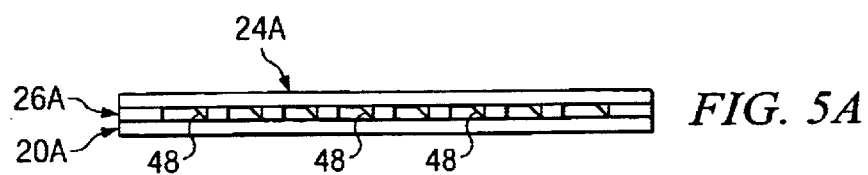
Figure 6:
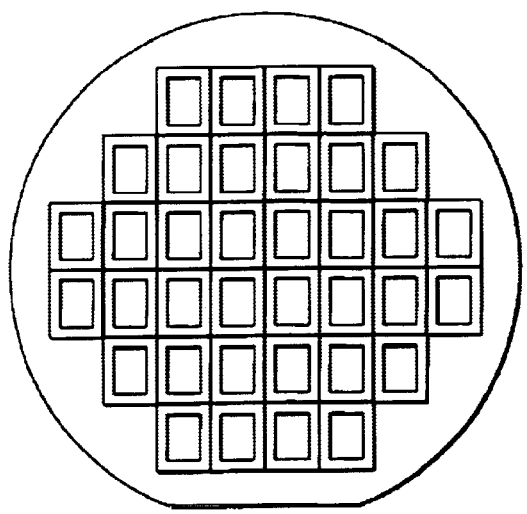
FIGS. 6 and 6A illustrate top and edge views similar to that of FIGS. 5 and 5A wherein the individual devices have been partially separated by sawing through the cover or window wafer and the grid members of the interposer wafer.
Figure 6A:
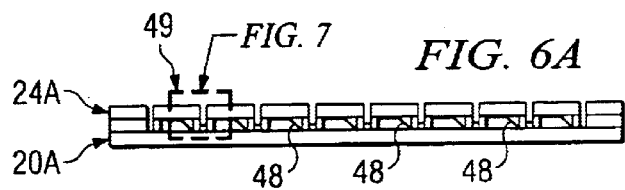

FIGS. 5 and 5A illustrate the combined cover of the interposer wafer 26a and the cover or window wafer 24a bonded to the substrate wafer 20a, and FIGS. 6 and 6A illustrate the top and side views similar to FIGS. 5 and 5A after cutting through the cover or window wafer 24a and the interposer wafer 26a to partially separate the individually packaged and sealed devices. It should be noted that the substrate wafer 20a remains in one piece.

Figure 7:
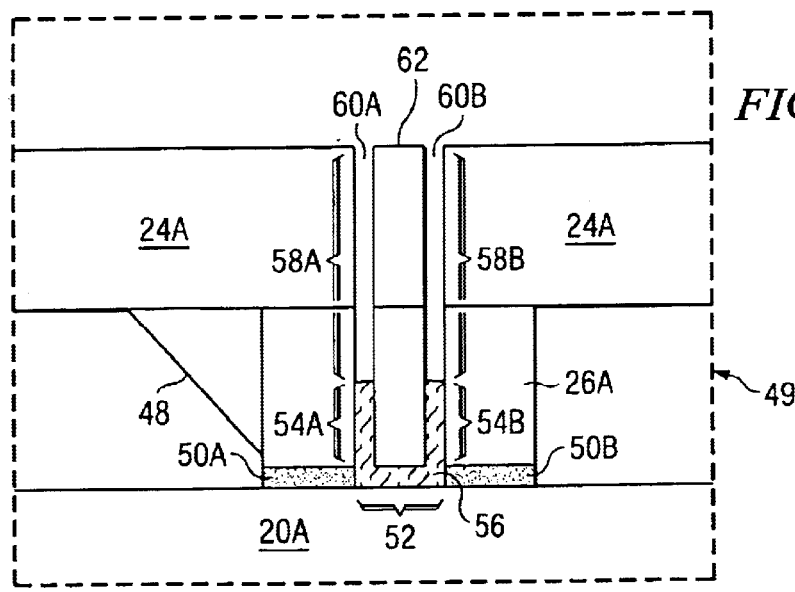
FIG. 7 shows a detailed view of one embodiment for partially separating the devices by cutting the top or window cover and the interposer wafer grid members.

Referring now to FIG. 7, there is shown an enlarged cross-sectional view of the area 49 of FIG. 6A where the cover wafer 24a and interposer wafer 26a are separated according to one embodiment of the invention. More specifically, after the bonded combination of cover wafer 24a and interposer wafer 26a are bonded to substrate wafer 20a as indicated by two strips of adhesion or bonding material 50a and 50b, a water soluble wax material may be drawn into the open area 52 and the parallel saw kerfs 54a and 54b by a vacuum. It will be recalled that the saw kerfs 54a and 54b were cut into the bottom of the grid members of interposer wafer 26a prior to bonding to the substrate wafer 20a. At the time the wax 56 is pulled or drawn into the existing saw kerfs 54a and 54b, the areas of the grid members and cover wafer 58a and 58b above the existing saw kerfs is still uncut. However, after area 52 and the saw kerfs 54a and 54b are filled with wax 56, two additional parallel saw kerfs 60a and 60b in register with the existing saw kerfs 54a and 54b are cut through the cover wafer 24a and the remaining material of the grid members making up interposer wafer 26a.

Thus, the separated piece 62 comprising a portion of window wafer 24a and a portion of the grid member making up interposer wafer 26a are retained in place by the wax material 56 after cutting saw kerfs 60a and 60b. The cut out piece of material 62 and the wax material 56 are then removed by a water bath to produce the structure of FIG. 6A.

As mentioned above, the individual devices with a sealed portion of 24a may be fully separated by scoring and breaking the substrate wafer 20a as discussed above.

Figure 8:
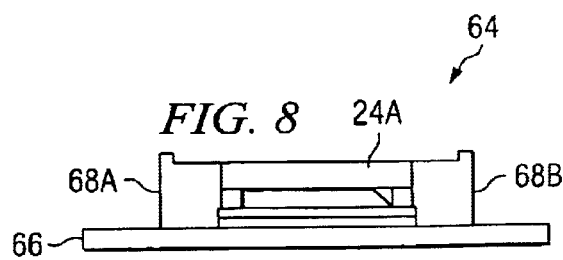
FIG. 8 shows an individual and separated device from FIG. 6A further including a lead frame and reinforcing epoxy material.

Then, as shown in FIG. 8, the sealed device structure 64 is bonded to a lead frame member 66, wire bonded for electrical contact and the sealed package is reinforced with a suitable epoxy-like material around the edges of the device as indicated at 68a and 68b. Additional packaging may be added so long as the transparent window portion 24a remains uncovered.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A wafer structure defining a multiplicity of devices individually sealed by a cover wafer comprising:

a substrate wafer having a selected size and including said multiplicity of devices formed thereon;

an interposer wafer with a top side and a substrate side and having substantially said selected size, said substrate side bonded to said substrate wafer and said interposer wafer comprising a first plurality of parallel and spaced apart grid members and a second plurality of parallel and spaced apart grid members intersecting said first plurality of grid members to define a multiplicity of open areas in register with said multiplicity of devices formed on said substrate wafer; and a top wafer having a top surface and a bottom surface and substantially said selected size and said bottom surface bonding to said top side of said interposer wafer so as to provide a seal along the perimeter of selected ones of said multiplicity of devices between parallel pairs of intersecting grid members and under said top wafer, said top wafer further defining kerfs cut through said top surface of said top wafer and said intersecting grid members of said interposer wafer to provide separation between individual ones of said sealed devices.

2. The wafer structure of claim 1 wherein said kerfs comprise a parallel pair of spaced kerfs.

3. The wafer structure of claim 2 wherein said substrate side of said grid member defines a parallel pair of spaced kerfs, and said kerfs defined in said top surface of said top wafer in register with said parallel kerfs defined in said substrate side of said grid members.

4. The wafer structure of claim 1 wherein said multiplicity of devices are MEMS devices.

5. The wafer structure of claim 4 wherein said multiplicity of MEMS devices are DMD™ spatial light modulators.

6. The wafer structure of claim 1 wherein said top wafer is transparent.

7. The wafer structure of claim 6 wherein said top wafer further comprises a non-transparent aperture mask comprised of intersecting dark lines formed on said transparent wafer to define said window areas.

8. The wafer structure of claim 7 wherein said first and second intersecting grid members are in register with said intersecting dark lines on said transparent wafer.

9. The wafer structure of claim 1 further comprising getter material on the sidewalls of said grid members of said interposer wafer such that each sealed device includes at least one portion of getter material in the sealed space.

10. The wafer structure of claim 1 wherein said interposer wafer has a thickness of between about 0.5 mm and about 1.1 mm.

11. The wafer structure of claim 1 wherein said top wafer has a thickness of between about 0.7 mm and about 3 mm.

12. A method of individually packaging devices formed on a wafer with a cover wafer comprising the steps of:

providing a plurality of devices formed on a wafer substrate having a selected size;

providing an interposer wafer having substantially said selected size and defining a plurality of open areas separated by a first plurality of parallel and spaced apart grid members intersecting a second plurality of parallel and spaced apart grid members, said interposer wafer having a top side and a substrate side and a selected thickness;

a bonding a top wafer having substantially said selected size to said top side of said first and second pluralities of intersecting grid members of said interposer wafer to form a cover wafer structure comprising said bonded top wafer and said interposer wafer defining individual device areas;

bonding said substrate side of said interposer wafer to said wafer substrate to provide a seal around the perimeter of selected ones of said plurality of devices between parallel pairs of intersection grid members and under said top wafer; and cutting through said top wafer and said intersecting grid member of said interposer wafer to provide separation between individual ones of said sealed devices.

13. The method of claim 12 further comprising the steps of sawing two parallel saw kerfs into the substrate side of said first and second pluralities and partially through said selected thickness to leave an uncut top portion prior to said step of bonding said cover wafer structure to said wafer structure.

14. The method of claim 12 wherein said top wafer is transparent such that said defined individual device areas are individual window areas.

15. The method of claim 14 wherein said plurality of devices are MEMS devices.

16. The method of claim 15 wherein said plurality of MEMS devices are DMD™ spatial light modulators.

17. The method of claim 14 further comprising the step of defining said transparent window areas by forming an aperture mask of intersecting dark lines on said transparent top wafer.

18. The method of claim 17 wherein said first and second pluralities of parallel intersecting grid members are in register with said intersecting dark lines on said transparent top wafer.

19. The method of claim 12 further comprising the step of applying a strip of getter material on at least one of the sides of said grid members of said interposer wafer such that each sealed device includes at least one strip of said getter material in the sealed space.

20. The method of claim 13 wherein said step of cutting comprises the step of sawing pairs of saw kerfs through said window wafer and through the uncut top portion of said intersecting grid members and wherein said saw kerfs are in register with said two parallel saw kerfs in said substrate side of said interposer wafer.

21. The method of claim 12 wherein said interposer wafer has a thickness of between about 0.5 mm to about 1.1 mm.

22. The method of claim 12 wherein said top wafer has a thickness of between about 0.7 mm and about 3 mm.

23. The method of claim 12 further comprising the steps of passivating the interior of said device prior to fully sealing said device.

24. The method of claim 12 further comprising the step of breaking said wafer substrate with said sealed MEMS device at said saw kerfs to divide said MEMS device into sealed and individual units.

25. The method of claim 24 further comprising the steps of encapsulating the sides of said sealed individual devices to provide additional support and protection.

* * * * *